(12) United States Patent
Yanagawa et al.

(10) Patent No.: US 6,562,736 B2
(45) Date of Patent: May 13, 2003

(54) MANUFACTURING METHOD FOR SEMICONDUCTOR DEVICE

(75) Inventors: Shusaku Yanagawa, Kanagawa (JP); Hideo Yamagata, Kanagawa (JP); Takeyoshi Koumoto, Tokyo (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 09/951,159

(22) Filed: Sep. 12, 2001

(65) Prior Publication Data

US 2002/0076871 A1 Jun. 20, 2002

(30) Foreign Application Priority Data

Sep. 13, 2000 (JP) ......................................... 2000-278349

(51) Int. Cl.[7] ............................................. H01L 21/477
(52) U.S. Cl. ........................................................ 438/795
(58) Field of Search ............................ 438/795, 486, 438/487

(56) References Cited

U.S. PATENT DOCUMENTS 5,854,803 A * 12/1998 Yamazaki et al. ............ 372/31
5,891,764 A * 4/1999 Ishihara et al. ............. 438/151
5,907,770 A * 5/1999 Yamazaki et al. .......... 438/149
6,080,643 A * 6/2000 Noguchi et al. ............ 438/487
6,136,632 A * 10/2000 Higashi ...................... 438/166
6,165,875 A * 12/2000 Fonash et al. .............. 438/486

* cited by examiner

*Primary Examiner*—David Nelms
*Assistant Examiner*—Thao P Le
(74) *Attorney, Agent, or Firm*—Robert J. Depke; Holland & Knight LLC (57) ABSTRACT

Disclosed herein is a manufacturing method for a semiconductor device, including heat treatment by light irradiation to a substrate having a base semiconductor and a semiconductor layer formed on the base semiconductor, the semiconductor layer being different in kind from the base semiconductor, wherein the temperature of the substrate is once maintained at an intermediate temperature between a starting temperature and an attainable maximum temperature, or the temperature rise rate from the starting temperature to the intermediate temperature is set smaller than that from the intermediate temperature to the attainable maximum temperature. Accordingly, in the lamp annealing after heteroepitaxial growth, the generation of dislocations in the heteroepitaxial layer can be reduced.

6 Claims, 10 Drawing Sheets

FIG. 11 ically, the
MANUFACTURING METHOD FOR SEMICONDUCTOR DEVICE

RELATED APPLICATION DATA

The present application claims priority to Japanese Application(s) No(s). P2000-278349 filed Sep. 13, 2000, which application(s) is/are incorporated herein by reference to the extent permitted by law.

BACKGOUND OF THE INVENTION

The present invention relates to a manufacturing method for a semiconductor device, and more particularly to an annealing method by light irradiation after heteroepitaxial growth.

With a continuous reduction in minimum size of a bipolar integrated circuit formed on a semiconductor substrate, especially, a silicon substrate, it is more and more difficult to realize the cutoff frequency ($f_T$), maximum oscillation frequency ($f_{max}$), and propagation delay ($\tau_{pd}$) of an associated transistor. This is due to the fact that parasitic factors related to the transistor increase with the reduction in minimum size.

The performance, especially, the cutoff frequency $f_T$ of a bipolar junction transistor (BJT) can be greatly improved by reducing the transit time of carriers in a base region and by reducing the area of a pn junction parasitically formed in the transistor to thereby minimize a parasitic capacity to an element.

The minimization of such parasitic factors tends to have a harmful effect on common-emitter current gain ($h_{fe}$) and collector-emitter breakdown voltage ($BV_{CEO}$). For example, base doping must be increased to maintain the collector-emitter breakdown voltage ($BV_{CEO}$) with a decrease in base width. This causes not only a reduction in the common-emitter current gain ($h_{fe}$), but also a reduction in time of exposure of this device to high temperatures during the subsequent processing. Accordingly, the cutoff frequency ($f_T$) of an actual bipolar junction transistor is basically limited to about 20 to 30 GHz.

To solve this problem, it has recently been proposed to form a heterojunction as an emitter-base junction. By adopting a structure such that the emitter has a large bandwidth and the base has a small bandwidth, the injection of holes from the base to the emitter can be suppressed by the difference between these bandwidths, so that the injection efficiency of electrons to be injected from the emitter to the base can be relatively increased. As a result, the current gain of a bipolar transistor can be ensured and other advantages can also be obtained.

The combination in the heterojunction includes a method using an emitter having a large bandwidth and a method using a base having a small bandwidth. The former is a method using a material having a large bandwidth, such as GaAs, SiC, and Si as the emitter (see Tech. Dig., IEDM, pp. 186–193, 1987). The latter is a method using a material having a small bandwidth, such as Si—Ge mixed crystal as the base by MBE (molecular beam epitaxy), MOCVD (metalorganic chemical vapor deposition), etc. (see 1988 Spring 35th Applied Physics Related Joint Lecture Meeting, 29aZ12/I).

In particular, a heterojunction bipolar transistor (HBT) using a III–V compound semiconductor such as GaAs is being most aggressively researched and developed. In recent years, however, attention has been given to a HBT using SiGe as a IV—IV compound that can be fabricated on an inexpensive Si substrate.

Si has an electron affinity of 4.05 eV, and Ge has an electron affinity of 4.0 eV which is substantially the same as the electron affinity of Si. Further, Si has a bandgap of 1.1 eV, and Ge has a bandgap of 0.66 eV. It has been reported that a Si—Ge mixed crystal has a bandgap width intermediate of that of Si or Ge (see Band alignments of coherently strained $Ge_xSi_{1-x}$/Si heterostructures on <011> $Ge_ySi_{1-y}$ substrates, Applied Physical Letters 48, Feb. 24, 1986). The combination of these materials allows the formation of a silicon heterojunction bipolar transistor having such a configuration that Si is used for the emitter, Ge or Ge—Si mixed crystal is used for the base, and Si is used for the collector.

In the transistor having the above configuration, a pn junction is formed at the interface between Si as the emitter and Si—Ge mixed crystal as the base. Accordingly, the energy barrier to holes is larger than that to electrons, so that the carriers diffused to flow in the pn junction are dominantly electrons. As a result, the emitter injection efficiency of the bipolar transistor using this heterojunction is largely increased.

Further, the injection of holes from the base to the emitter can be suppressed to eliminate the delay by the holes accumulated in the emitter. Further, a junction capacity between the emitter and the base can be reduced by a low concentration in the emitter. With these advantages, the above configuration is greatly effective in forming a high-speed bipolar transistor.

However, in the case of using a material having a small bandwidth, e.g., Si—Ge mixed crystal ($Si_{1-x}Ge_x$) formed by MBE, MOCVD, or LP-CVD, as the base, there is a problem of crystal defects such as dislocations and cracks when a Si—Ge mixed crystal layer having a considerably large thickness is deposited on a Si single-crystal substrate, because Si and Si—Ge mixed crystal have different lattice constants to cause lattice mismatch between the Si—Ge mixed crystal layer and the Si substrate. For this reason, a thick Si—Ge mixed crystal layer cannot be deposited on the Si substrate.

To increase the emitter injection efficiency, the change in bandwidth at the emitter-base junction must be steep. On the emitter side of the emitter-base junction, the injection of holes must be merely suppressed, so that the Si single-crystal layer as an emitter electrode on the Ge layer or Si—Ge mixed crystal layer as the base may be thin (e.g., 5 to 10 nm). Accordingly, epitaxial growth with no defects can be carried out between the base and the emitter.

However, there is a trade-off between base thickness and base resistance such that the latter increases with a decrease in the former. Accordingly, a required thickness of the base layer is about 10 to 100 nm. The thickness of the Si—Ge mixed crystal layer must be greater than or equal to the above required thickness of the base layer. Further, to ensure a sufficient bandgap difference between the emitter and the base, the composition x in $Si_{1-x}Ge_x$ must be greater than or equal to 0.1. Accordingly, the thickness of the Si—Ge layer to be deposited on the Si substrate must be 50 to 300 nm.

It has been reported that when a $Si_{1-x}Ge_x$ layer where x is near 0.5 having a thickness of 10 nm or more is formed on a Si substrate, dislocations are generated in the $Si_{1-x}Ge_x$ layer (see SILICON MBE: FROM STRAINED-LAYER EPITAXY TO DEVICE APPLICATION: Journal of Crystal Growth 70 (1984), 444–451). Further, in the case of growing a $Si_{1-x}Ge_x$ layer where x is greater than 0.5 having a thickness of 50 nm or more on a Si substrate, misfit dislocations due to lattice mismatch are generated in the Si—Ge layer to cause crystal defects in the base region.

The crystal defects become the recombination centers of carriers to reduce the emitter injection efficiency or cause penetration between the emitter and the collector. Thus, the crystal defects are a significant problem in obtaining normal transistor characteristics. At present, there has not yet been established any techniques for forming a single thick Si—Ge mixed crystal layer simultaneously satisfying the two requirements that the concentration of Ge is to be increased to ensure a sufficient bandgap difference between emitter and base and that a sufficient base thickness is to be ensured.

There have been reported various methods for eliminating or suppressing the propagation of dislocations in a heteroepitaxial grown layer on a Si substrate. A well known one of these methods is annealing after heteroepitaxial growth to be performed to reduce defects. For example, such annealing is described in the paper by J. W. Lee et al., Appl. Phys. Lett. 50, 31 (1987), the paper by Choi et al., Appl. Phys. Lett. 50, 992 (1987), and the paper by N. Chand et al., Appl. Phys. Lett. 49, 815 (1986).

It has been proved that annealing after heteroepitaxial growth itself is effective in reducing a wide area of defects in a heteroepitaxial layer on a Si substrate. In general, the introduction of impurity into an emitter silicon layer is performed by diffusion of n-type impurity from a polysilicon film deposited on the emitter silicon layer. This diffusion is made by using a lamp annealer having halogen lamps allowing rapid heating, in order to form a shallow junction.

Figure 11:
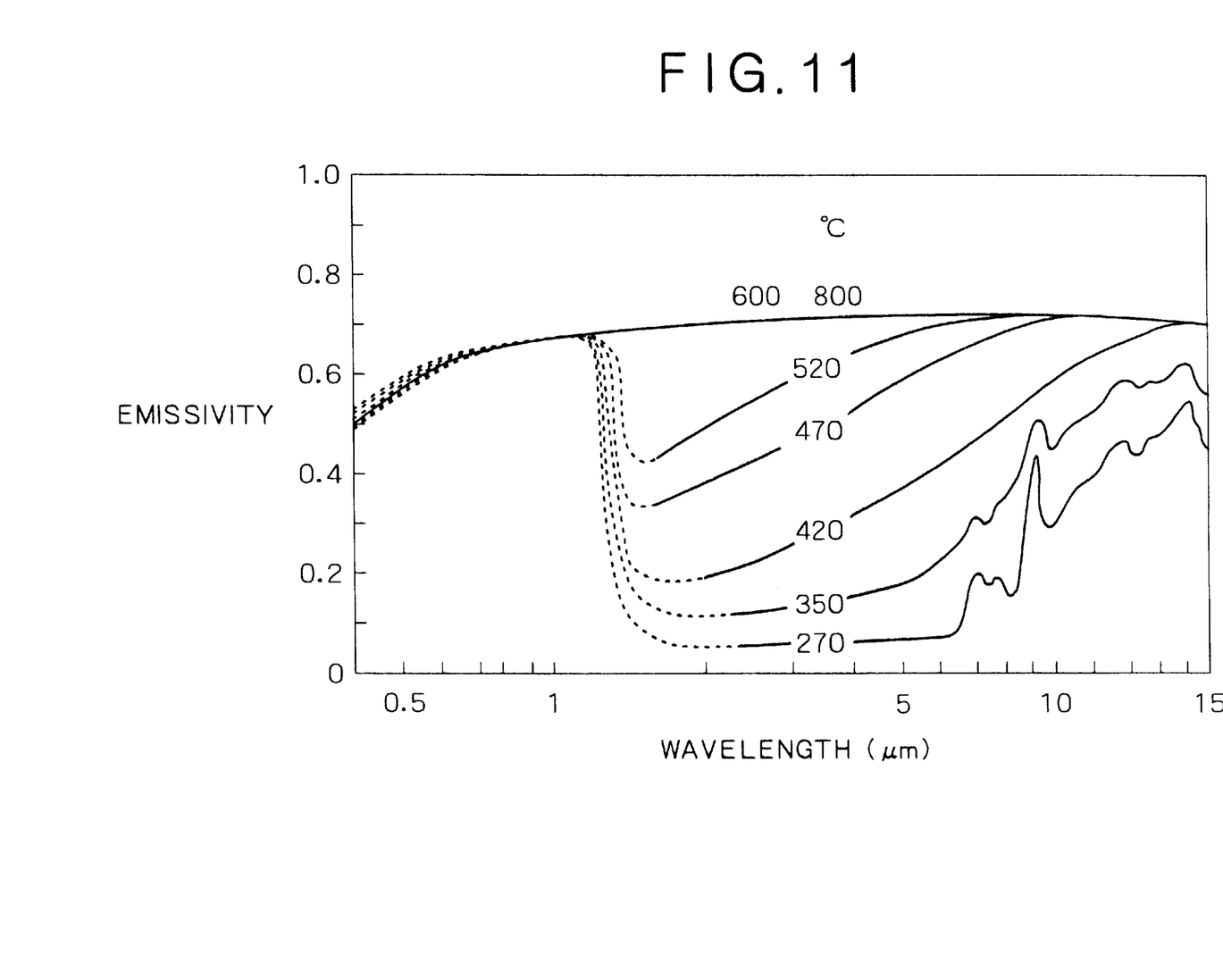
FIG. 11 is a graph showing the relation between emissivity of Si and wavelength.

During the annealing, thermal strain is caused by the difference in coefficient of thermal expansion between the Si layer and the Si—Ge mixed crystal layer, and the propagation of dislocations is accelerated by the relaxation of this thermal strain. In particular, as shown in FIG. 11, the emissivity of Si includes a transition absorption region at shorter wavelengths of 1.1 eV or more (1.4 $\mu$m or less) of the bandgap and a vibration absorption region due to lattice vibration at longer wavelengths of 10 $\mu$m or more. A wavelength region between the transition absorption region and the vibration absorption region is referred to as a window, in which the emissivity is dependent upon impurity and temperature. In the wavelength regions other than the window, the emissivity is not so dependent upon temperature and wavelength, but almost fixed at about 0.7 (1.0 for black body). In contrast, the emissivity in the window region is remarkably dependent upon temperature at temperatures lower than 600° C. At such lower temperatures, the lower the temperature, the higher the transmissivity of infrared radiation. At temperatures higher than 600° C., especially, 700° C., the emissivity in the window region becomes substantially the same as that in the other wavelength regions.

The Si—Ge mixed crystal layer has a bandgap width intermediate of that of Si or Ge as mentioned above. Accordingly, in Si—Ge mixed crystal, the transition absorption region is shifted to longer wavelengths, and the Si layer and the Si—Ge mixed crystal layer have different temperature rise rates in heating by lamp annealing, so that thermal stress is generated to accelerate the propagation of dislocations.

SUMMARY OF THE INVENTION

It is accordingly an object of the present invention to provide a manufacturing method for a semiconductor device which allows the formation of heterojunction devices such as heterojunction transistors at a high yield with reduced defects, and particularly to provide an annealing technique therefor.

In accordance with an aspect of the present invention, there is provided a manufacturing method for a semiconductor device, including heat treatment by light irradiation to a substrate having a base semiconductor and a semiconductor layer formed on the base semiconductor, the semiconductor layer being different in kind from the base semiconductor, wherein the temperature of the substrate is once maintained at an intermediate temperature between a starting temperature and an attainable maximum temperature.

By once maintaining the temperature of the substrate at the intermediate temperature between the starting temperature and the attainable maximum temperature, the temperatures of the base substrate and the semiconductor layer formed on the base substrate can be made equal to each other at the intermediate temperature, thereby suppressing thermal stress during the subsequent temperature rise.

The intermediate temperature is a temperature at which there is no difference in light absorption between the base substrate and the semiconductor layer. More specifically, the intermediate temperature is set in the range of 600 to 800° C., preferably, 700 to 800° C. If the intermediate temperature is set higher than 800° C., a temperature difference between the base substrate and the semiconductor layer becomes unnegligible, causing an increase in thermal stress, so that it is difficult to reduce the propagation of dislocations.

In accordance with another aspect of the present invention, there is provided a manufacturing method for a semiconductor device, including heat treatment by light irradiation to a substrate having a base semiconductor and a semiconductor layer formed on the base semiconductor, the semiconductor layer being different in kind from the base semiconductor, wherein a temperature rise rate from a starting temperature to an intermediate temperature between the starting temperature and an attainable maximum temperature is set smaller than that from the intermediate temperature to the attainable maximum temperature.

By setting the temperature rise rate from the starting temperature to the intermediate temperature smaller than the temperature rise rate from the intermediate temperature to the attainable maximum temperature, the temperatures of the base substrate and the semiconductor layer formed on the base substrate can be made equal to each other at the intermediate temperature, thereby suppressing thermal stress during the subsequent temperature rise.

The intermediate temperature is a temperature at which there is no difference in light absorption between the base substrate and the semiconductor layer. More specifically, the intermediate temperature is set in the range of 600 to 800° C., preferably, 700 to 800° C., and the temperature rise rate from the starting temperature to the intermediate temperature is set to 20° C./sec or less.

Other objects and features of the invention will be more fully understood from the following detailed description and appended claims when taken with the accompanying drawings.

DETAILED DESCRIPTION OF THE PREFERRED EMBODIMENTS

A preferred embodiment of the present invention will now be described with reference to the drawings.

Figure 1:
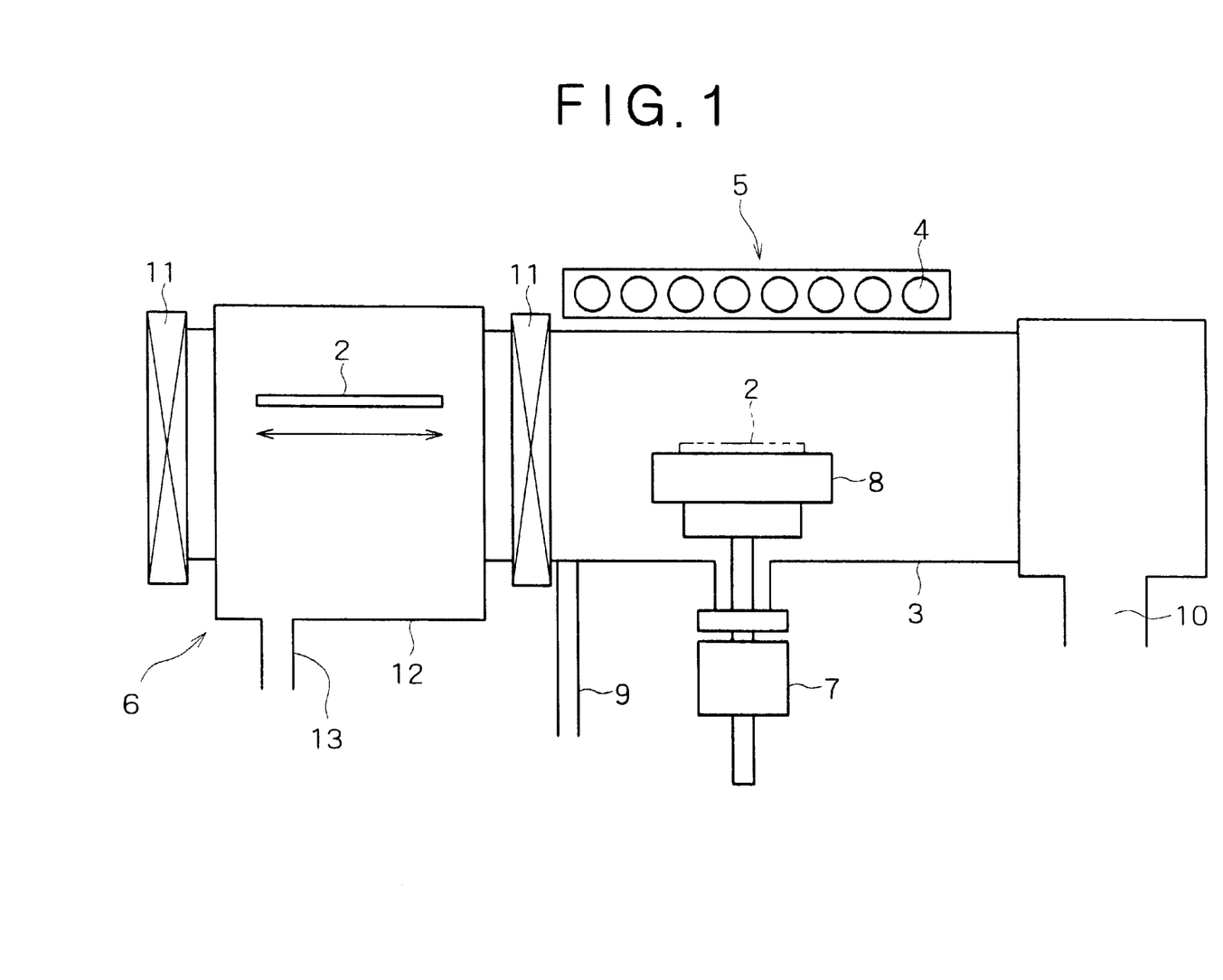
FIG. 1 is a schematic diagram of a low-pressure CVD system used in a preferred embodiment of the present invention.

FIG. 1 is a schematic diagram of a low-pressure CVD system 1 used in a preferred embodiment of the present invention.

The low-pressure CVD system 1 includes a quartz chamber (i.e., reaction chamber) 3 in which a substrate (e.g., semiconductor wafer) 2 is subjected to vapor deposition of semiconductor layers, heating means 5 having a plurality of infrared lamps (e.g., halogen lamps) 4 as heating means by light irradiation for heating the inside of the quartz chamber 3 to a required temperature, and a transfer unit 6 for transferring the substrate 2 to the quartz chamber 3.

A susceptor 8 is provided in the quartz chamber 3 so as to be rotatable by a motor 7. The surface of the susceptor 8 is coated with a SiC film by CVD. Reactant gases are supplied through a gas supply section 9 into the chamber 3, and resultant gases after reaction are exhausted through an exhaust section 10. The gas supply section 9 is provided with inline gas purifiers (not shown). The transfer unit 6 has a load lock chamber 12 provided with an exhaust section 13. A pair of gate valves 11 are provided on the substrate inlet side of the load lock chamber 12 and on the substrate outlet side of the load lock chamber 12 connected to the quartz chamber 3.

Figure 2:
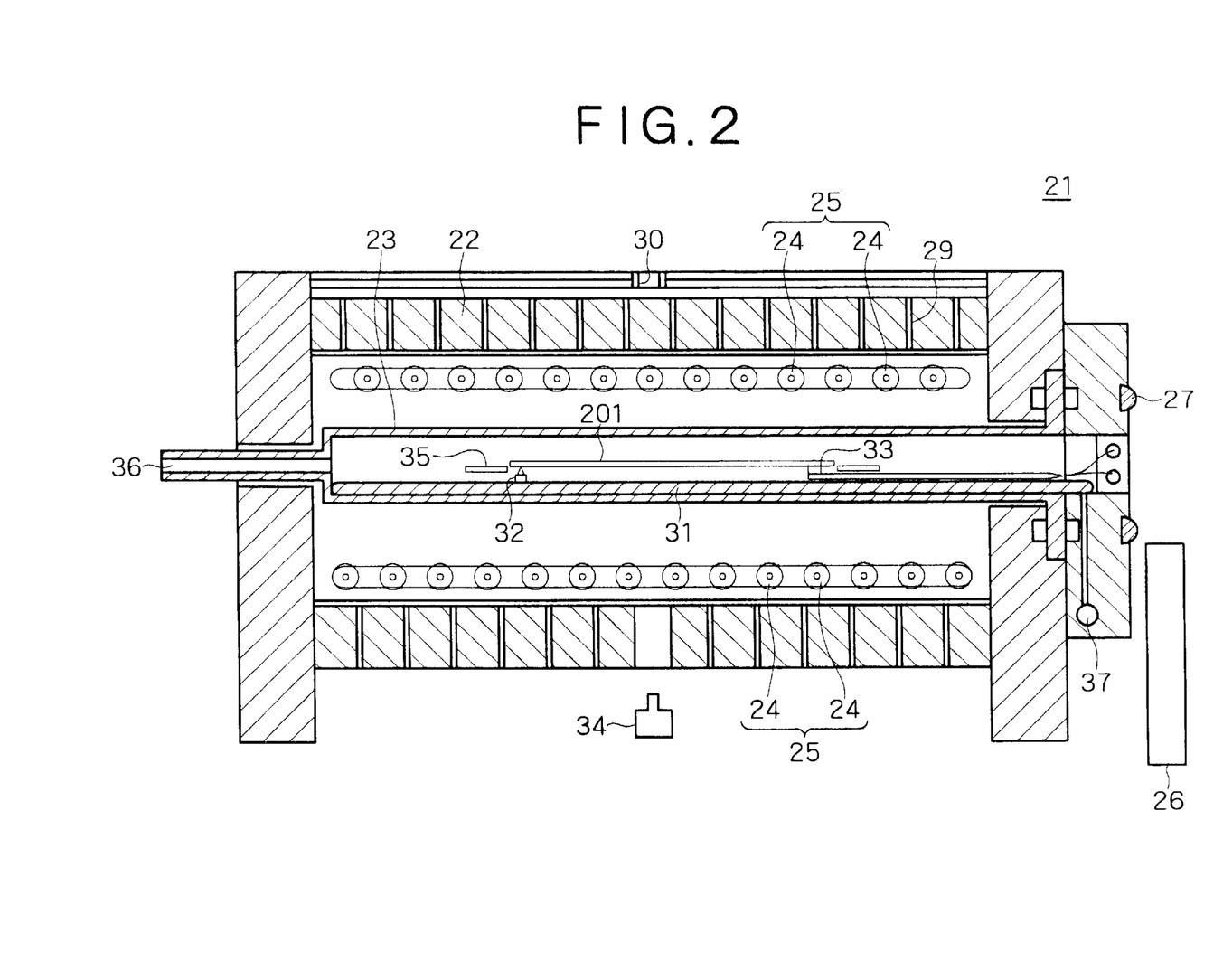
FIG. 2 is a schematic sectional view of a lamp annealer used in the preferred embodiment of the present invention.

FIG. 2 is a schematic sectional view of a lamp annealer 21 as a heating unit by light irradiation used in the preferred embodiment of the present invention.

The lamp annealer 21 includes an enclosure 22, a quartz glass tubular member (heating furnace) 23 provided in the enclosure 22 to accommodate a substrate 201 to be subjected to heat treatment (e.g., a semiconductor substrate or wafer having semiconductor layers formed by heteroepitaxial growth), and a pair of heating means 25 provided in the enclosure 22 so as to interpose the quartz glass tubular member 23 on the upper and lower sides thereof. Each heating means 25 consists of a plurality of infrared lamps (e.g., halogen lamps) 24 for light irradiation. The quartz glass tubular member 23 has a high transmissivity to infrared radiation. The upper and lower infrared lamps 24 are opposed to the inner wall surface of the enclosure 22, which is coated with gold, for example.

A door 26 is provided on one side of the quartz glass tubular member 23 from which the substrate 201 is inserted. The door 26 is opened and closed in inserting the substrate 201 into the tubular member 23 or in removing the substrate 201 from the tubular member 23. Further, a resin packing (O-ring) 27 is provided on the substrate insertion side of the tubular member 23 to hermetically seal the tubular member 23 in combination with the door 26. The enclosure 22 has a water cooling structure 29 and an air cooling structure by $N_2$ gas or air supplied from a gas inlet opening 30.

A quartz tray 31 for supporting the substrate 201 is provided in the quartz glass tubular member 23. The substrate 201 is horizontally supported by two quartz pins 32 projecting from the quartz tray 31 and by a front end portion of a contact type thermocouple 33. The thermocouple 33 has a temperature measuring portion (alloy portion) covered with SiC having excellent heat conductivity, thereby providing a structure such that heat conduction from the substrate 201 is improved, that the surface area is reduced to minimize direct absorption of light, and that the heat capacity is reduced to improve thermal response. Further, the thermocouple 33 has strands at a portion except the temperature measuring portion (alloy portion). The strands are covered with quartz excellent in transmissivity to infrared radiation, thereby providing a structure such that direct absorption of light in the cover material at the portion except the temperature measuring portion is minimized. The temperature of the substrate 201 is controlled by a closed loop in which the temperature of the substrate 201 measured by the thermocouple 33 is fed back to the outputs of the infrared lamps 24.

In the annealing process, a required atmospheric gas is supplied from a gas inlet opening 36 formed at one end of the tubular member 23. After the heat treatment, the atmospheric gas is removed from a gas outlet opening 37 formed at the other end of the tubular member 23. Reference numeral 34 denotes a pyrometer for measuring the temperature of the infrared lamps 24, and reference numeral 35 denotes a guard ring provided in the tubular member 23.

In this preferred embodiment, a semiconductor wafer (e.g., Si wafer) is used as the substrate 2 to grow a heteroepitaxial layer on a principal surface of the Si wafer 2 by using the low-pressure CVD system 1 shown in FIG. 1. That is, a semiconductor layer different in kind from Si, e.g., a Si—Ge mixed crystal layer 15 (see FIG. 4), is epitaxially grown on the principal surface of the Si wafer 2, and a Si layer 16 (see FIG. 4) is further epitaxially grown on the Si—Ge mixed crystal layer 15. More specifically, the Si wafer 2 cleaned is first transferred into the load lock chamber 12 subjected to purging with $N_2$. After evacuation of the load lock chamber 12, the outlet gate valve 11 interposed between the load lock chamber 12 and the quartz chamber 3 is opened to transfer the Si wafer 2 into the quartz chamber 3 and place it on the susceptor 8 in the quartz chamber 3. Thereafter, required reactant gases for epitaxial growth of Si—Ge mixed crystal are supplied through the gas supply section 9 into the quartz chamber 3 to epitaxially grow the Si—Ge mixed crystal layer 15 having a relatively large thickness on the Si wafer 2. Thereafter, required reactant gases for epitaxial growth of Si are supplied to the quartz chamber 3 to epitaxially grow the Si layer 16 on the Si—Ge mixed crystal layer 15.

Figure 4:
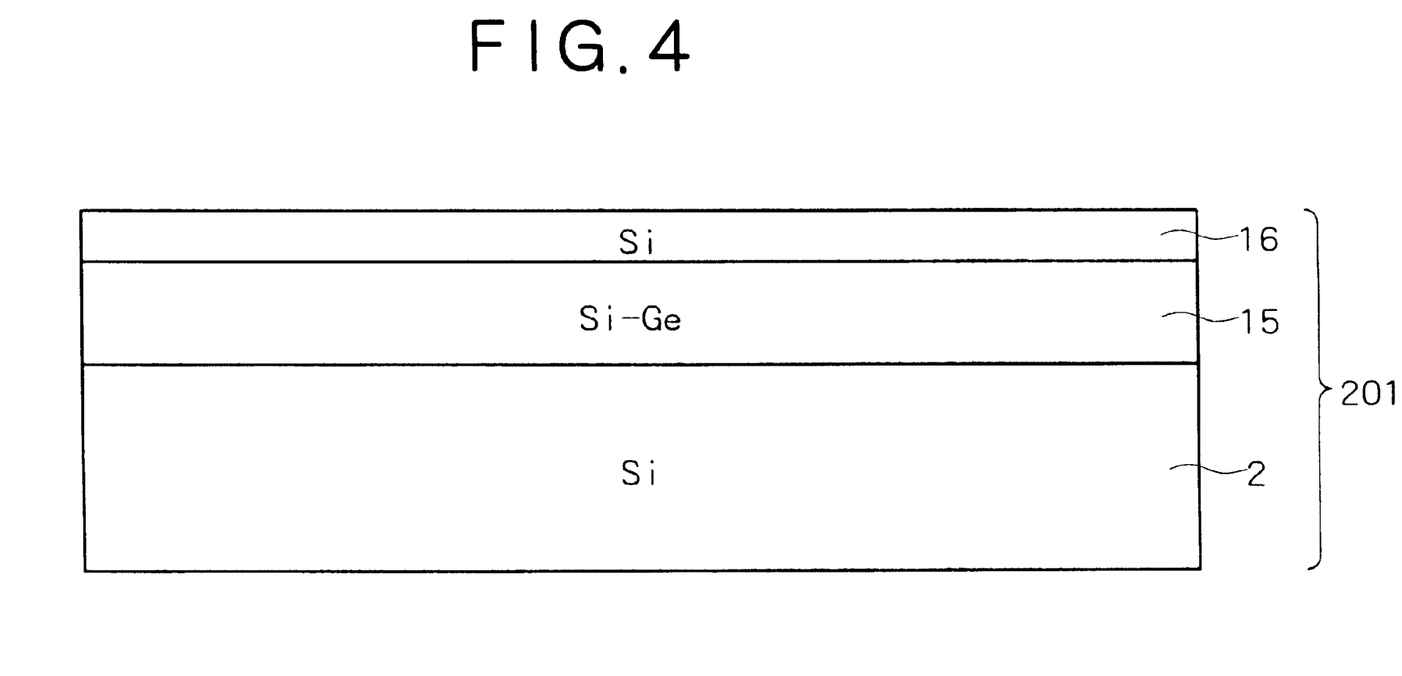
FIG. 4 is a sectional view of a semiconductor substrate used in the preferred embodiment of the present invention.

Thus, the heteroepitaxial layers, i.e., the Si—Ge mixed crystal layer 15 and the Si layer 16, are grown on the Si wafer 2 to obtain the semiconductor substrate (semiconductor wafer) 201 shown in FIG. 4. In the semiconductor substrate 201, dislocations (crystal defects) are generated in the Si—Ge mixed crystal layer 15 because of lattice mismatch. In the case of forming a thin layer as the Si layer 16, epitaxial growth can be made with no defects.

The semiconductor substrate 201 is next subjected to annealing after heteroepitaxial growth by using the lamp annealer 21 shown in FIG. 2 to reduce the dislocations in the heteroepitaxial layer 15.

Figure 3A:
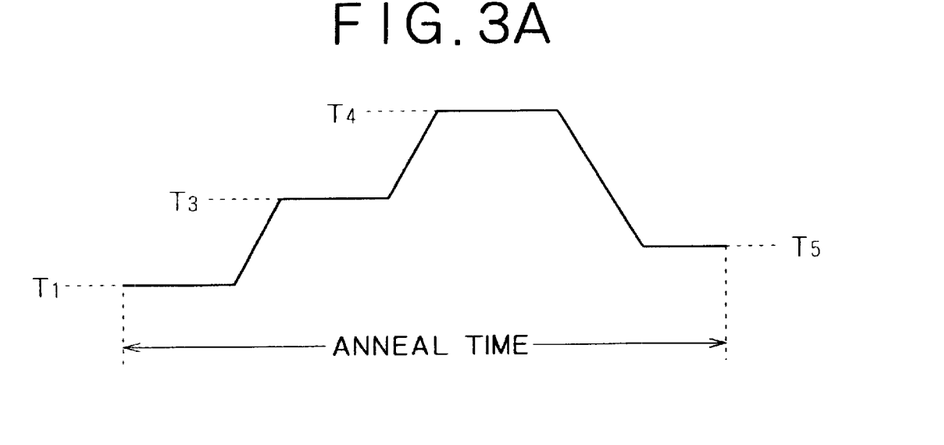
FIG. 3A is a diagram showing a temperature sequence as a first example of lamp annealing according to the present invention.
Figure 3B:
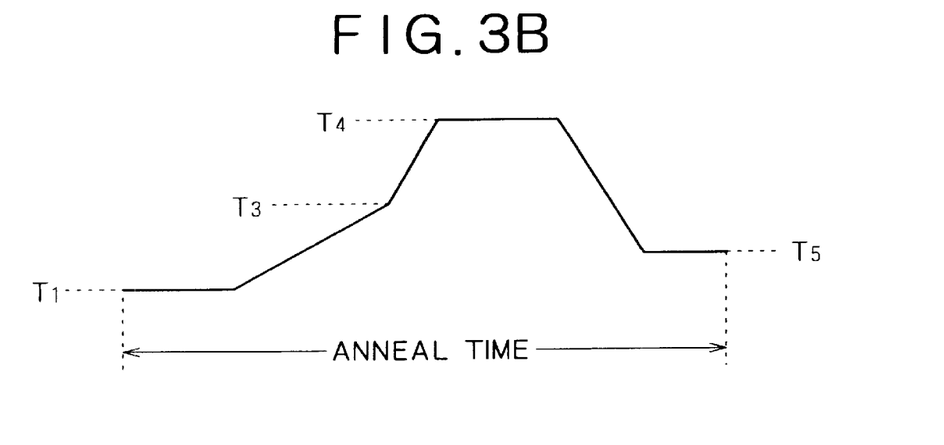
FIG. 3B is a diagram showing a temperature sequence as a second example of lamp annealing according to the present invention.
Figure 3C:
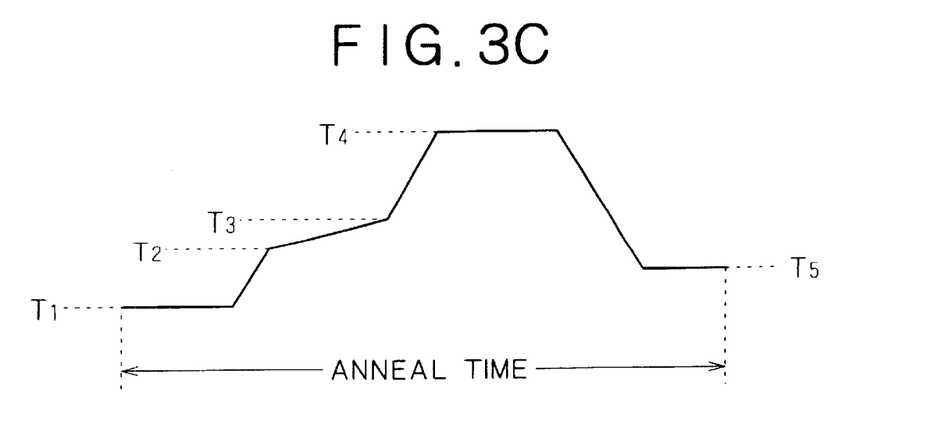
FIG. 3C is a diagram showing a temperature sequence as a third example of lamp annealing according to the present invention.

In this preferred embodiment, the lamp annealing to the semiconductor substrate 201 is performed in accordance with the temperature sequence shown in FIG. 3A, 3B, or 3C. In the case of FIG. 3A, for example, a step is provided at a given temperature lower than an attainable max temperature $T_4$, or at a given intermediate temperature $T_3$ between a starting temperature $T_1$ and the attainable maximum temperature $T_4$. That is, the semiconductor substrate 201 is first heated from the starting temperature $T_1$ to the intermediate temperature $T_3$ at a given temperature rise rate. Thereafter, the temperature of the semiconductor substrate 201 is once maintained at the intermediate temperature $T_3$ for a given time period. Thereafter, the semiconductor substrate 201 is heated from the intermediate temperature $T_3$ to the attainable maximum temperature $T_4$ at the given temperature rise rate. The intermediate temperature $T_3$ may be set to a temperature such that the absorption of infrared radiation in the window region shown in FIG. 11 as mentioned previously becomes substantially the same as that in the wavelength regions other than the window region. In the case of growing a heteroepitaxial layer on a Si wafer, the intermediate temperature $T_3$ may be set to 600 to 800° C., preferably, 700 to 800° C.

The time period for maintaining the intermediate temperature $T_3$ may be set to at least a value such that the temperature of the Si—Ge mixed crystal layer is stabilized to the intermediate temperature $T_3$, i.e., at least a value such that an overshoot is converged.

In the case that the lamp annealing is performed in accordance with the temperature sequence shown in FIG. 3A, the temperature of the semiconductor substrate 201 is once maintained for a given time period after reaching the intermediate temperature $T_3$. Accordingly, rising of the temperature of Si lower in temperature rise rate than Si—Ge is awaited for this retention time period. That is, the light absorptivity of Si becomes the same as that of Si—Ge at the intermediate temperature $T_3$, so that the temperatures of the Si substrate 2, the Si layer 16, and the Si—Ge mixed crystal layer 15 coincide with each other at the intermediate temperature $T_3$. Thereafter, the temperatures of these members 2, 15, and 15 similarly rise up to the attainable maximum temperature $T_4$, so that thermal stress during the temperature rise to the attainable maximum temperature $T_4$ can be suppressed. Accordingly, the relaxation of lattice strain due to thermal stress can be suppressed to reduce the propagation of dislocations in the Si—Ge mixed crystal layer 15.

In this preferred embodiment, the lamp annealing may be performed in accordance with the temperature sequence shown in FIG. 3B.

In this case, the temperature rise rate from the starting temperature $T_1$ to the intermediate temperature T3 is set smaller than that from the intermediate temperature $T_3$ to the attainable maximum temperature $T_4$. That is, the semiconductor substrate 201 is heated slowly from the starting temperature $T_1$ to the intermediate temperature $T_3$, and subsequently heated at a normal temperature rise rate from the intermediate temperature $T_3$ to the attainable maximum temperature $T_4$. The temperature rise rate from the starting temperature $T_1$ to the intermediate temperature $T_3$ is preferably set to 20° C./sec or less.

Further, in this preferred embodiment, the lamp annealing may be performed in accordance with the temperature sequence shown in FIG. 3C.

In this case, the temperature rise rate from a first intermediate temperature $T_2$ lower than the intermediate temperature (a second intermediate temperature) $T_3$ to the second intermediate temperature $T_3$ is set smaller than the temperature rise rate from the starting temperature $T_1$ to the first intermediate temperature $T_2$ and the temperature rise rate from the second intermediate temperature $T_3$ to the attainable maximum temperature $T_4$. That is, the semiconductor substrate 201 is heated at a normal temperature rise rate from the starting temperature $T_1$ to the first intermediate temperature $T_2$, next heated slowly from the first intermediate temperature $T_2$ to the second intermediate temperature $T_3$, and finally heated at a normal temperature rise rate from the second intermediate temperature $T_3$ to the attainable maximum temperature $T_4$. The temperature rise rate from the first intermediate temperature $T_2$ to the second intermediate temperature $T_3$ is preferably set to 20° C./sec or less.

Also in the case of performing the lamp annealing in accordance with the temperature sequence shown in FIG. 3B or 3C, an effect similar to that mentioned above with reference to FIG. 3A can be exhibited. That is, the temperatures of the Si substrate 2, the Si layer 16, and the Si—Ge mixed crystal layer 15 coincide with each other at the intermediate temperature $T_3$, and thermal stress during the temperature rise from the intermediate temperature $T_3$ to the attainable maximum temperature $T_4$ can be suppressed. Accordingly, the propagation of dislocations in the Si—Ge mixed crystal layer 15 can be reduced.

A specific example of the manufacturing method according to the present invention will now be described.

Figure 5:
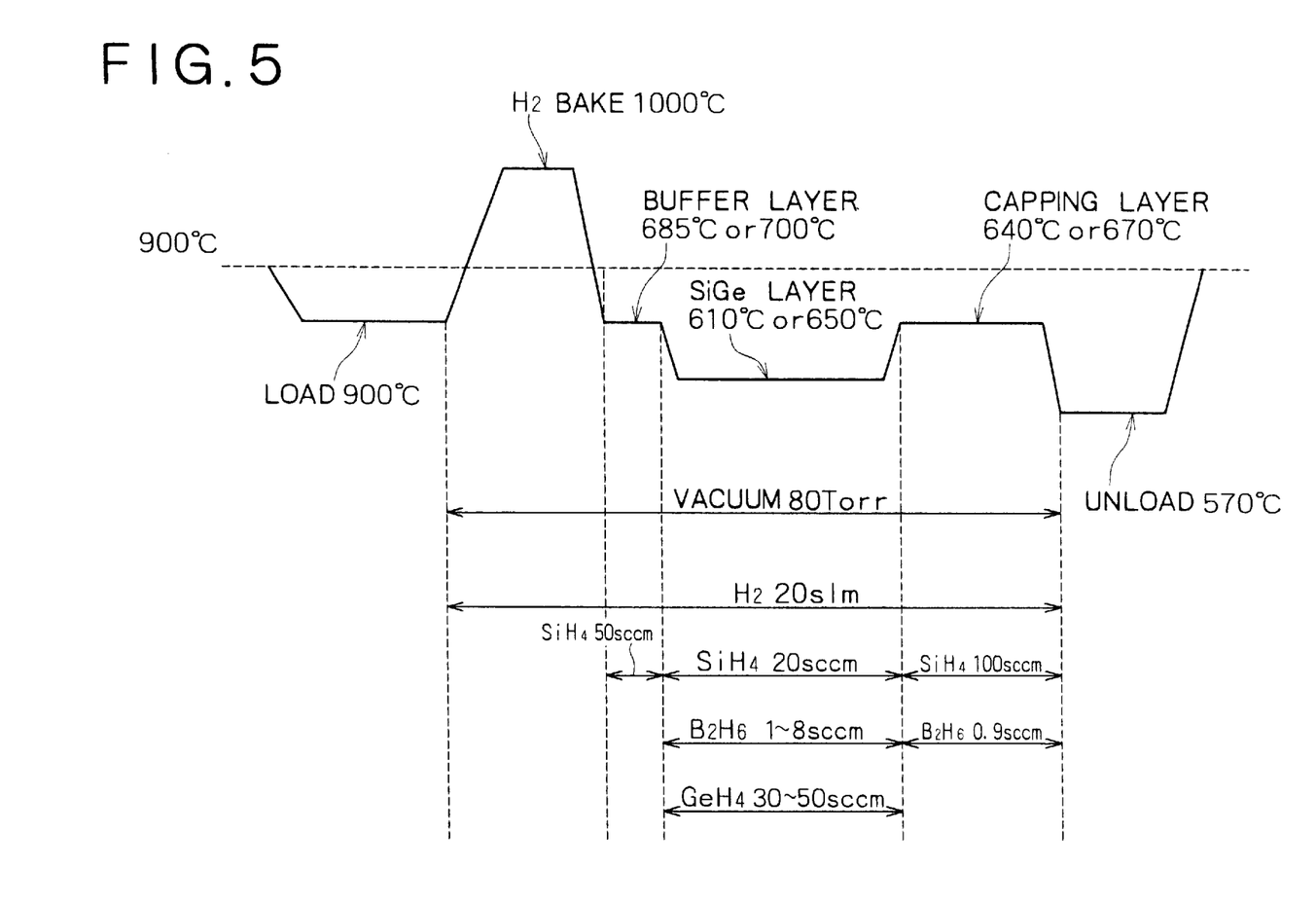
FIG. 5 is a diagram showing a temperature sequence and a gas supply sequence in the low-pressure CVD system shown in FIG. 1.

FIG. 5 shows an example of the gas supply sequence and the temperature sequence in the low-pressure CVD system 1.

In this example, a semiconductor wafer (e.g., Si (100) CZp type wafer) is used as the substrate 2. After cleaning the semiconductor wafer 2 by using HF, $NH_4OH/H_2O_2/H_2O$ solution, and $HC_1/H_2O_2/H_2O$ solution, thermal oxidation is performed to grow a thermal oxide film having a given thickness (e.g., 200 nm) on a principal surface of the semiconductor wafer 2. Thereafter, a required resist pattern having numerous square openings is formed on the thermal oxide film, and the semiconductor wafer 2 is treated with HF to remove the thermal oxide film at its portions corresponding to the openings of the resist pattern, thereby obtaining a thermal oxide film 41 having numerous square openings each having a size of 105 $\mu$m×105 $\mu$m (see FIG. 6A).

Figure 6A:
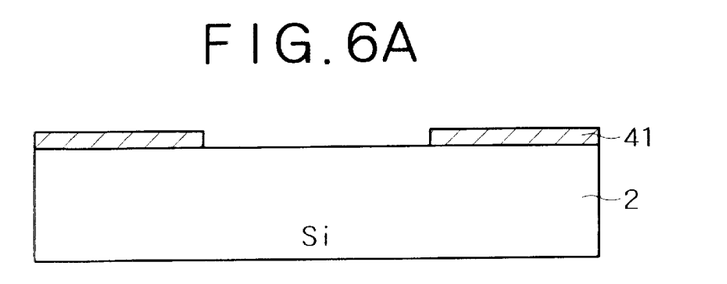
FIGS. 6A to 6D are sectional views showing a fabrication process for a sample wafer having a heteroepitaxial layer according to the preferred embodiment of the present invention.

The semiconductor wafer 2 having the thermal oxide film 41 is next cleaned by using $NH_4OH/H_2O_2/H_2O$ solution and $HC_1/H_2O_2/H_2O$ solution. Further, immediately before transferring the semiconductor wafer 2 to the low-pressure CVD system 1, the semiconductor wafer 2 is cleaned by using HF (0.5%) and pure water, and next dried by using a spin drier.

Thereafter, the semiconductor wafer 2 is transferred to the low-pressure CVD system 1 shown in FIG. 1. That is, the semiconductor wafer 2 is first transferred into the load lock chamber 12 subjected to purging with $N_2$. After evacuation of the load lock chamber 12, the outlet gate valve 11 interposed between the load lock chamber 12 and the quartz chamber (reaction chamber) 3 is opened to transfer the semiconductor wafer 2 into the quartz chamber 3 and place it on the susceptor 8. The quartz chamber 3 is evacuated to a required vacuum, e.g., 80 Torr. The wafer 2 is heated by the infrared lamps 4.

Figure 6B:
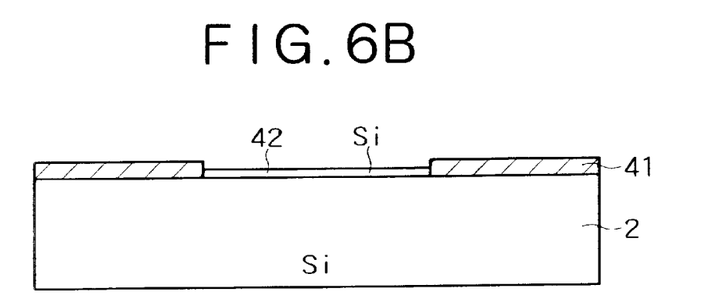
Figure 6C:
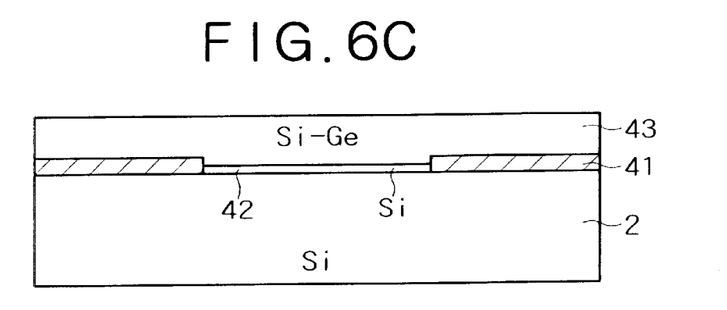

After transferring the wafer 2 into the quartz chamber 3, $H_2$ baking at about 100° C. is performed to remove a native oxide film formed on the wafer 2 in the cleaning step with pure water and during the transfer of the wafer 2 in the atmospheric air. In the $H_2$ baking, a carrier gas ($H_2$ gas) is supplied at about 20 slm. Thereafter, $SiH_3$ gas is supplied at a required flow rate, e.g., 50 sccm at a required temperature, e.g., about 685° C. or 700° C. to grow a Si layer 42 as a buffer layer having a given thickness, e.g., about 15 nm (see FIG. 6B). Thereafter, $SiH_4$, $B_2H_6$, and $GeH_4$ gases are supplied at controlled flow rates such that the peak concentration of boron becomes $1 \times 1019$ atoms/$cm^2$ and the concentration of Ge becomes 15%. For example, $SiH_4$ is supplied at 20 sccm, $B_2H_6$ is supplied at 1 to 8 sccm, and GeH4 is supplied at 30 to 50 sccm at a temperature of about 610° C. or 650° C. to grow a Si—Ge layer 43 having a given thickness, e.g., about 100 nm (see FIG. 6C). Thereafter, a Si layer (cap layer) 44 having a given thickness, e.g., about 80 nm for forming an emitter is formed on the Si—Ge layer 43 at a temperature of about 640° C. or 670° C. by supplying $SiH_4$ at 100 sccm and $B_2H_6$ at 0.9 sccm (see FIG. 6D). Thus, a sample wafer 201 shown in FIG. 6D is obtained.

Figure 7:
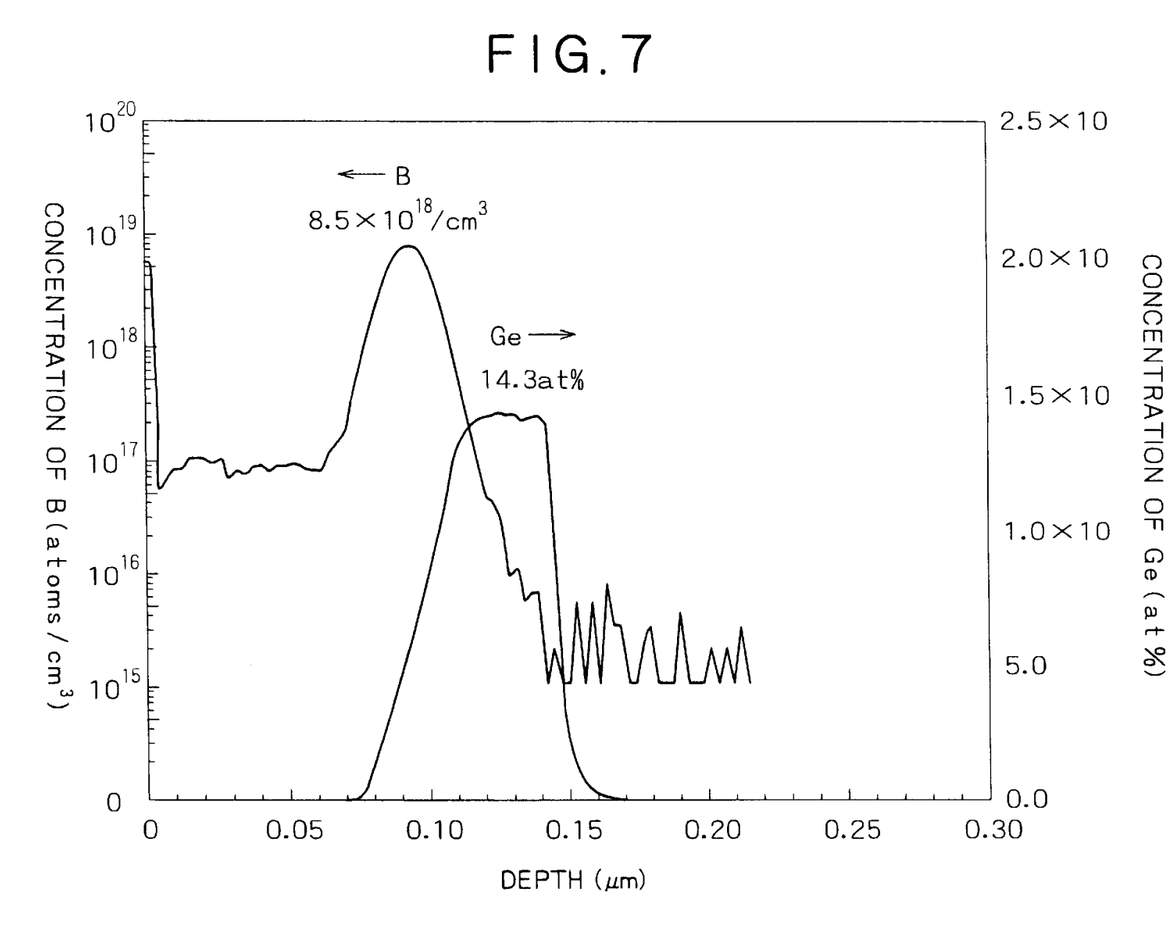
FIG. 7 is a graph showing concentration distributions of boron (B) and germanium (Ge) in the sample wafer shown in FIG. 6D.

FIG. 7 shows concentration profiles of boron (B) and germanium (Ge) in the sample wafer 201 having the cap layer 44/Si—Ge layer 43/buffer layer 42 configuration measured by using SIMS.

Further, a generation density of dislocations in epitaxial growth is strongly dependent upon the growth temperatures of the cap layer 44/Si—Ge layer 43/buffer layer 42.

Figure 6D:
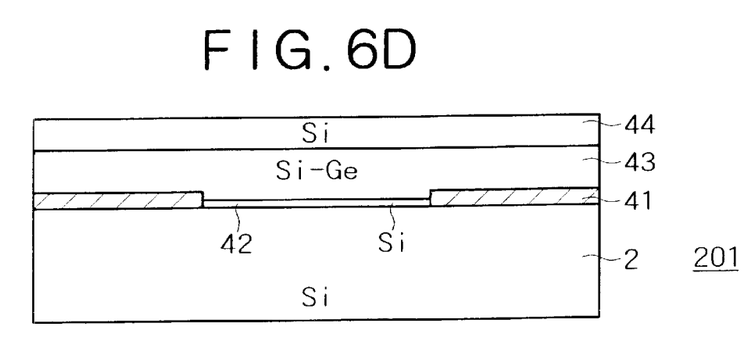

Thereafter, the sample wafer 201 shown in FIG. 6D is subjected to annealing using the lamp annealer 21 shown in FIG. 2, in order to confirm a difference in propagation of dislocations according to the sequence of the annealing. In this example, the sample wafer 201 is annealed in accordance with two kinds of sequences shown in FIGS. 8 and 9. In each sequence, a $N_2$ gas is supplied at 2 slm into the quartz glass tubular member 23. The levels of evaluation are shown in Table 1.

Figure 9:
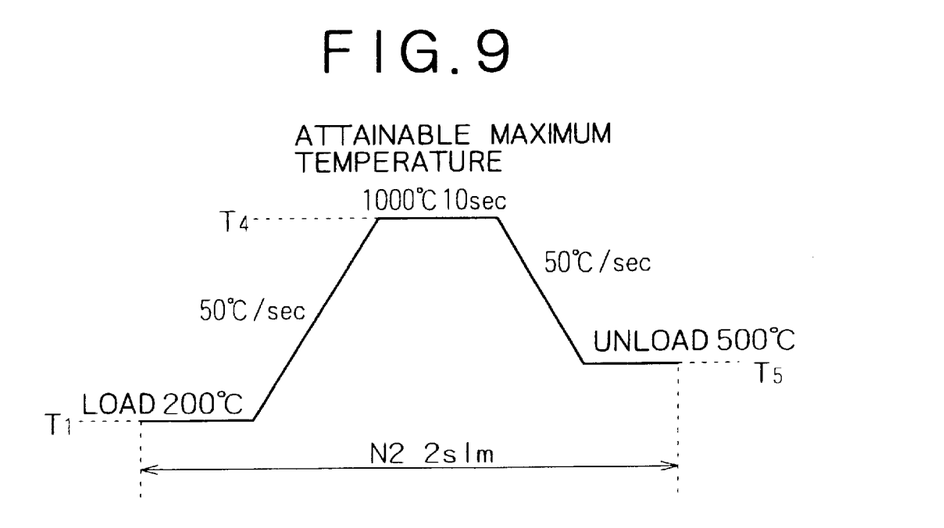
FIG. 9 is a diagram similar to FIG. 8, showing a comparison.

The sequence shown in FIG. 9 as a comparison will now be described. The atmosphere inside the quartz glass tubular member 23 is fixed to an atmosphere of $N_2$ by supplying a $N_2$ gas at about 2 slm. The starting temperature $T_1$ is set to about 200° C. After transferring the sample wafer 201 into the tubular member 23 and maintaining the starting temperature $T_1$ for a given time period, the sample wafer 201 is continuously heated from the temperature $T_1$ to the attainable maximum temperature $T_4$, e.g., about 1000° C. at a temperature rise rate of 50!n/sec, and the attainable maximum temperature $T_4$ is next maintained for about 10 sec. Thereafter, the temperature is lowered to a temperature $T_5$ of about 500° C. at a temperature fall rate of 50° C./sec, and this temperature $T_5$ is next maintained for a given time period. Thereafter, the annealing is ended to remove the sample wafer 201 from the tubular member 23. This sequence is a sequence having no step anneal between the starting temperature $T_1$ and the attainable maximum temperature $T_4$.

Figure 8:
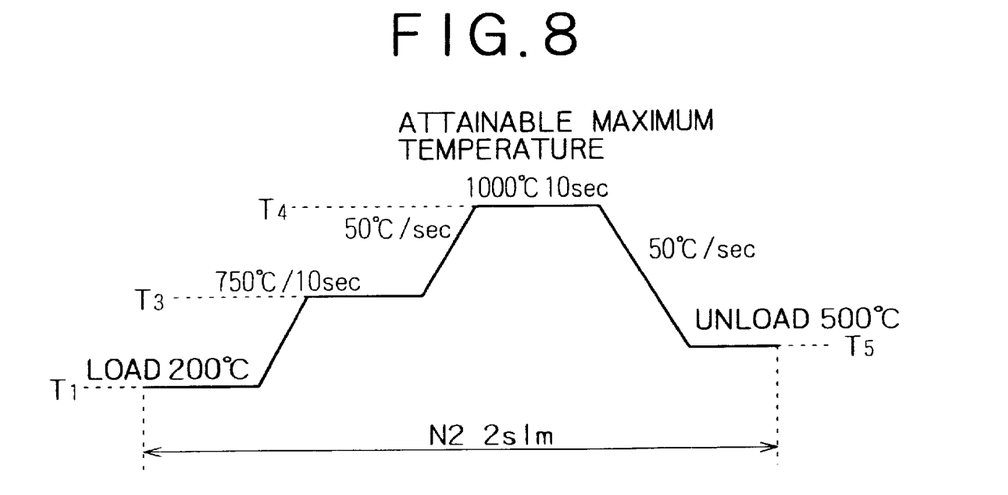
FIG. 8 is a diagram showing a specific example of the temperature sequence for lamp annealing according to the preferred embodiment.

The sequence shown in FIG. 8 according to the present invention will now be described. The atmosphere inside the tubular member 23 is fixed to an atmosphere of $N_2$ by supplying a $N_2$ gas at about 2 slm. The starting temperature $T_1$ is set to about 200° C. After transferring the sample wafer 201 into the tubular member 23 and maintaining the starting temperature $T_1$ for a given time period, the sample wafer 201 is first heated from the starting temperature $T_1$ to the intermediate temperature $T_3$, e.g., about 750° C. at a temperature rise rate of 50° C./sec, and the intermediate temperature $T_3$ is next maintained for about 10 sec. Thereafter, the sample wafer 201 is heated from the intermediate temperature $T_3$ to the attainable maximum temperature $T_4$, e.g., about 1000° C. at a temperature rise rate of 50!n/sec, and the attainable maximum temperature $T_4$ is next maintained for about 10 sec. Thereafter, the temperature is lowered to a temperature $T_5$ of about 500° C. at a temperature fall rate of 50!n/sec, and this temperature $T_5$ is next maintained for a given time period. Thereafter, the annealing is ended to remove the sample wafer 201 from the tubular member 23. This sequence is a sequence having a step anneal between the starting temperature $T_1$ and the attainable maximum temperature $T_4$.

TABLE 1

| Level | Epitaxial Growth conditions | Lamp Anneal conditions | Pattern Size ($\mu$m) |
|---|---|---|---|
| 1 | buffer layer 700° C. SiGe layer 650° C. cap layer 670° C. | 1000° C. 10 sec | 105 × 105 |
| 2 | buffer layer 700° C. SiGe layer 650° C. cap layer 670° C. | Not applied | 105 × 105 |
| 3 | buffer layer 700° C. SiGe layer 650° C. cap layer 670° C. | 750° C. 10 sec/ 1000° C. 10 sec | 105 × 105 |

A selective etching process using a mixed solution of hydrofluoric acid:nitric acid (61%):acetic acid:water= 1:15:3:1 is applied to each sample wafer 201 shown in Table 1 to selectively etch crystal defects so that they can be observed by a microscope. In this condition, of the total, or 1300 square patterns each having a size of 105 $\mu$m×105 $\mu$m arranged in a matrix on each sample wafer 201, the number of the patterns where the generation of dislocations is observed is counted to check the generation of dislocations depending on the grow temperatures and to also check the propagation of dislocations due to the subsequent annealing.

Figure 10:
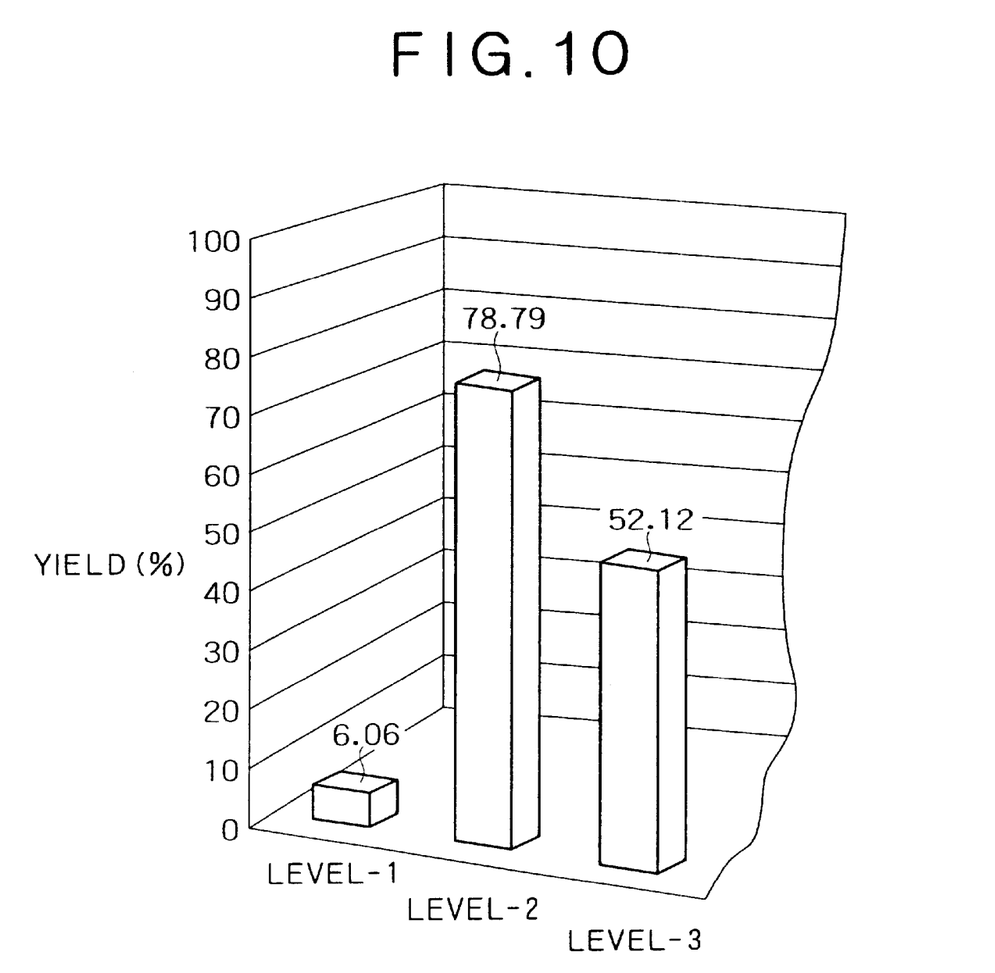
FIG. 10 is a graph showing the results of evaluation in relation to the temperature sequences shown in FIGS. 8 and 9.

The results of evaluation are shown in Table 2 and FIG. 10, in which the term of "Yield (%)" means the proportion of the square patterns where no dislocations are generated to the total 1300 square patterns (i.e., (the number of the patterns where no dislocations are generated)×100/1300).

TABLE 2

| Level | Epitaxial Growth conditions | Lamp Anneal conditions | Pattern Size ($\mu$m) | Yield |
|---|---|---|---|---|
| 1 | buffer layer 700° C. SiGe layer 650° C. cap layer 670° C. | 1000° C. 10 sec | 105 × 105 | 6.1 |
| 2 | buffer layer 700° C. SiGe layer 650° C. cap layer 670° C. | Not applied | 105 × 105 | 78.8 |
| 3 | buffer layer 700° C. SiGe layer 650° C. cap layer 670° C. | 750° C. 10 sec/ 1000° C. 10 sec | 105 × 105 | 52.1 |

As apparent from Table 2 and FIG. 10, there is a difference in amount of generation of dislocations according to the sequence of the lamp annealing after the epitaxial growth. In the case of the sequence shown in FIG. 8 wherein the step anneal at 750° C. for 10 sec is performed, an increase in dislocations is slight with less dependence on the growth temperatures of the epitaxial layers. To the contrary, in the case of the sequence shown in FIG. 9 wherein no step anneal is performed, an increase in dislocations is remarkable.

Although not shown in Table 2, it is confirmed that the lower the growth temperatures of the epitaxial layers, the less the generation of dislocations after the epitaxial growth.

Thus, by heating the wafer 201 to about 750° C. and then maintaining this temperature of the wafer 201 for a given time period (e.g., 10 sec) in the lamp annealing, the generation of dislocations can be suppressed. This is considered to be due to the fact that there is a difference in light absorptivity between the Si—Ge layer and the Si layer at temperatures lower than 600° C., so that the temperature rise speed of the Si—Ge layer is different from that of the Si layer at such lower temperatures, causing thermal stress due to a difference in coefficient of thermal expansion.

Accordingly, in the case of continuously heating the wafer 201 up to 1000° C. without providing a step, the relaxation of lattice strain due to thermal stress proceeds to remarkably generate dislocations. To the contrary, in a temperature region not lower than 750° C., the light absorptivity of the Si—Ge layer is similar to that of the Si layer. Accordingly, by maintaining the temperature of the wafer 201 at about 750° C. to make the temperatures of the Si—Ge layer and the Si layer equal to each other, thermal stress during the subsequent temperature rise can be suppressed.

In actual, the evaluation was made by changing the intermediate temperature in the range of 600 to 800° C. As the result of this evaluation, the generation of dislocations in this temperature range was similar to that at 750° C. Further, in the case of lowering the temperature rise rate from the starting temperature to the intermediate temperature ranging from 600 to 800° C., to 20° C./sec or less (corresponding to the sequence shown in FIGS. 3B or 3C), a similar effect was obtained.

While the present invention is applied to the lamp annealing of a semiconductor substrate formed by epitaxially growing Si—Ge as a IV—IV compound on a Si substrate and subsequently epitaxially growing Si on the Si—Ge layer in the above preferred embodiment, various modifications may be made. For example, the present invention may be applied to the lamp annealing of a semiconductor substrate formed by epitaxially growing Si—Ge as a IV—IV compound on a Si substrate as a minimum basic structure. Further, the present invention may be applied to the lamp annealing of a semiconductor substrate having any heteroepitaxial layer of a III–V compound semiconductor such as GaAs (including the case of heteroepitaxial growth on a semi-insulating compound semiconductor substrate).

According to the present invention as described above, in the heat treatment by light irradiation to a substrate having a base semiconductor and a semiconductor layer different in kind from the base semiconductor, i.e., a so-called heteroepitaxial layer grown on the base semiconductor, the relaxation of lattice strain due to thermal stress can be suppressed to thereby suppress the propagation of dislocations in the heteroepitaxial layer.

Accordingly, heterojunction devices such as heterojunction transistors can be manufactured at a high yield with reduced defects.

While the invention has been described with reference to specific embodiments, the description is illustrative and is not to be construed as limiting the scope of the invention. Various modifications and changes may occur to those skilled in the art without departing from the spirit and scope of the invention as defined by the appended claims.

What is claimed is:

1. A manufacturing method for a semiconductor device, comprising the steps of:

performing heat treatment by applying light irradiation to a substrate having a base semiconductor and a semiconductor layer formed on said base semiconductor, said semiconductor layer being different in kind from said base semiconductor, wherein the temperature of said substrate is temporarily maintained at an intermediate temperature between a starting temperature and an attainable maximum temperature.

2. A manufacturing method according to claim 1, wherein said intermediate temperature is a temperature at which there is no difference in light absorption between said base substrate and said semiconductor layer.

3. A manufacturing method according to claim 1, wherein said intermediate temperature is set in the range of 600 to 800° C.

4. A manufacturing method for a semiconductor device, comprising the steps of:

performing heat treatment by applying light irradiation to a substrate having a base semiconductor and a semiconductor layer formed on said base semiconductor, said semiconductor layer being different in kind from said base semiconductor, wherein a temperature rise rate from a starting temperature to an intermediate temperature between said starting temperature and an attainable maximum temperature is set smaller than that from said intermediate temperature to said attainable maximum temperature.

5. A manufacturing method according to claim 4, wherein said intermediate temperature is a temperature at which there is no difference in light absorption between said base substrate and said semiconductor layer.

6. A manufacturing method according to claim 4, wherein said intermediate temperature is set in the range of 600 to 800° C., and said temperature rise rate from said starting temperature to said intermediate temperature is set to 20° C./sec or less.

* * * * *